(12) United States Patent
Kim

(10) Patent No.: US 11,143,713 B2
(45) Date of Patent: Oct. 12, 2021

(54) INTEGRATED EARTH LEAKAGE CURRENT DETECTOR AND BREAKER CIRCUIT

(71) Applicant: SunnyIC Corporation, Seoul (KR)

(72) Inventor: Sun-Jung Kim, Seoul (KR)

(73) Assignee: SUNNYIC CORPORATION, Seoul (KR)

( * ) Notice: Subject to any disclaimer, the term of this patent is extended or adjusted under 35 U.S.C. 154(b) by 17 days.

(21) Appl. No.: 16/878,574

(22) Filed: May 19, 2020

(65) Prior Publication Data

US 2020/0278401 A1 Sep. 3, 2020

Related U.S. Application Data

(63) Continuation of application No. PCT/KR2019/003122, filed on Mar. 18, 2019.

(30) Foreign Application Priority Data

May 31, 2018 (KR) .................. 10-2018-0063031

(51) Int. Cl.
| | |
|---|---|
| *H02H 3/00* | (2006.01) |
| *G01R 31/52* | (2020.01) |
| *H02H 1/00* | (2006.01) |
| *H02H 3/16* | (2006.01) |

(52) U.S. Cl.
CPC .......... *G01R 31/52* (2020.01); *H02H 1/0007* (2013.01); *H02H 3/16* (2013.01)

(58) Field of Classification Search
None
See application file for complete search history.

(56) References Cited

U.S. PATENT DOCUMENTS

| | | | |
|---|---|---|---|
| 9,438,112 B2* | 9/2016 | Guerra | H02M 7/538 |
| 10,886,003 B2* | 1/2021 | Lee | G11C 16/08 |
| 2015/0054475 A1* | 2/2015 | Sawada | G01R 31/2841 |
| | | | 323/235 |
| 2020/0150189 A1* | 5/2020 | Lee | G01R 23/02 |

FOREIGN PATENT DOCUMENTS

| | | |
|---|---|---|
| JP | 2013-174613 A | 9/2013 |
| KR | 10-2007-0107453 A | 11/2007 |
| KR | 10-0956162 B1 | 5/2010 |
| KR | 10-2016-0008923 A | 1/2016 |
| KR | 10-2017-0123096 A | 11/2017 |

* cited by examiner

*Primary Examiner* — Stephen W Jackson
(74) *Attorney, Agent, or Firm* — TIPS Group

(57) ABSTRACT

A semiconductor integrated circuit for leak current detection which outputs an interruption signal to cut off electrical power supplied by a power supply to an electric line if a leakage current occurs including a leakage current processing unit and an output unit configured to output the interruption signal. The leakage current processing unit includes: a zero-power supply voltage detector; a counter when the power supply voltage pulse signal is input; a zero-input induction voltage detector configured to output a leakage current pulse signal whenever the input induction voltage becomes 0 V; a counter latch configured to latch a count value supplied by the counter and output the latched count value; an output induction voltage setting unit configured to calculate an output induction voltage; and a comparator configured to compare the output induction voltage with a predetermined trip level.

10 Claims, 5 Drawing Sheets

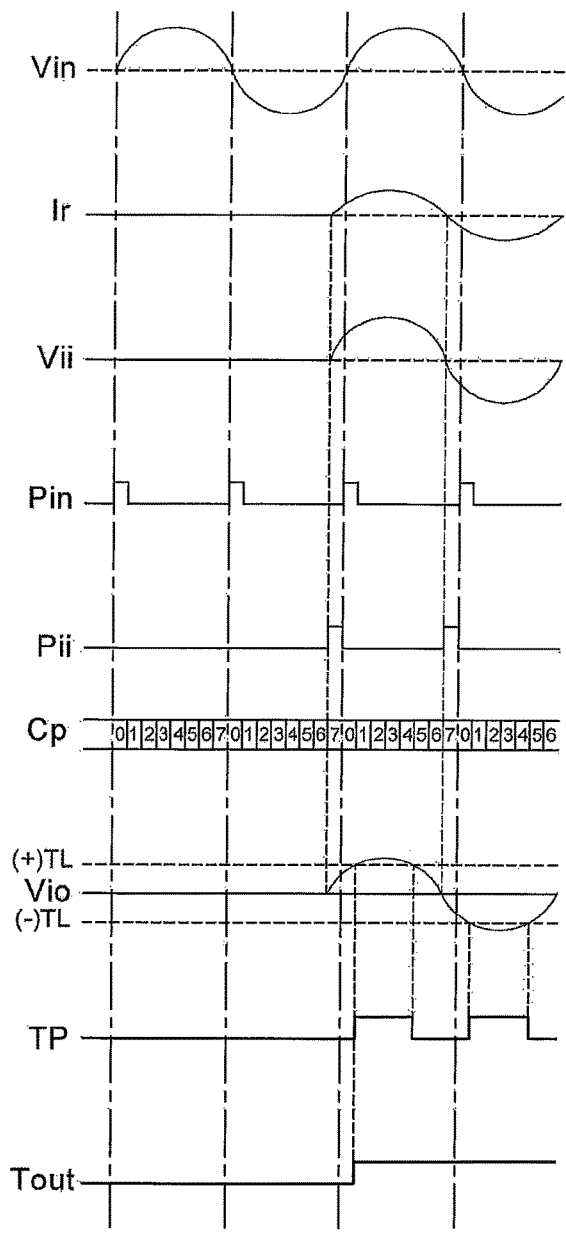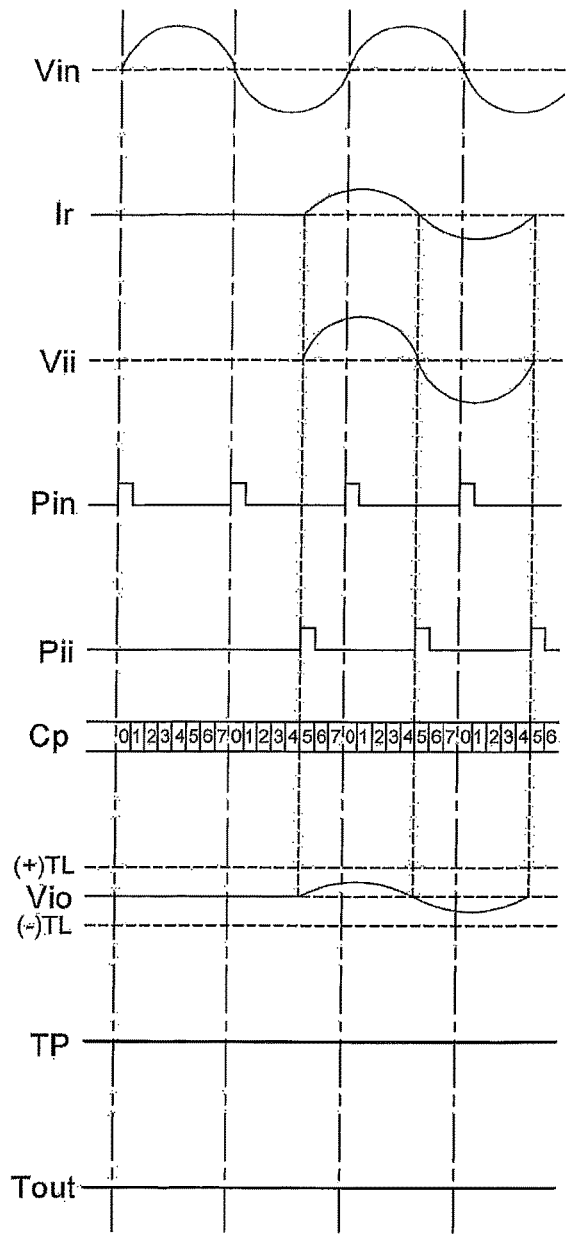
FIG. 6
FIG. 7

INTEGRATED EARTH LEAKAGE CURRENT DETECTOR AND BREAKER CIRCUIT

CROSS REFERENCE TO RELATED APPLICATION(S)

This application is a continuation of Int'l. Pat. Appl. No. PCT/KR2019/003122, filed Mar. 18, 2019, which claims the benefit of Korean Pat. Appl. No. 10-2018-0063031, filed May 31, 2018, both of which are incorporated herein by reference.

NOTICE OF GOVERNMENT SUPPORT

This invention was made with government support of the Republic of Korea under Grant Numbers S2829460 awarded by the Ministry of SMEs and Startups.

BACKGROUND

The present invention relates to an integrated circuit for detecting leakage current and an earth leakage circuit breaker having the integrated circuit, and in particular, to an integrated circuit for detecting leakage current and an earth leakage circuit breaker having the integrated circuit, that can improve a malfunction of the earth leakage circuit breaker due to a reactance type leakage current such as an inductive reactance type leakage current generated by a coil, etc., or a capacitive reactance type leakage current generated by capacitance such as that generated by a capacitor.

As a device for detecting electric leakage due to ground faults in various electric lines or electric devices, etc., and cutting off electrical powers to the electric lines, etc. to interrupt a power supply to the electric lines or devices when detecting an electric leakage, an earth leakage circuit breaker has been widely used.

In general, the leakage current includes a resistance type leakage current caused by aging or damage of a line, and a reactance type leakage current generated by an inductive or capacitive reactance generated between the line and the ground.

The resistance type leakage current among these leakage currents is the same as a power supply voltage in terms of phase and has a high risk of fire due to a generation of heat.

However, the reactance type leakage currents, particularly among them, the capacitive reactance type leakage current generated by the capacitance between the electric line and the ground is faster by 90 degrees in terms of phase than the power supply voltage. On the other hand, the inductive reactance type leakage current generated by the coil, etc., is slower by 90 degrees in terms of phase than the power supply voltage, as well as, the inductive reactance type leakage current has no generated heat, and thus has a low risk of fire.

In an integrated circuit for detecting leakage current of a conventional earth leakage circuit breaker, the earth leakage circuit breaker is also operated by a reactance type leakage current which does not actually involve the risk of fire. Once a leakage current due to the ground fault occurs, regardless of whether the leakage current is the resistance type leakage current or the reactance type leakage current, if a magnitude of the induced voltage due to the leakage current exceeds a trip level, there is a problem that an interruption signal is unconditionally output to operate the earth leakage circuit breaker.

Meanwhile, as a solution for solving the above-described problem, there is a technique described in Patent Document 1 (Korean Patent Registration Publication No. 10-0876651, published on Jan. 9, 2009).

FIG. 1 is a diagram illustrating a schematic configuration of an earth leakage circuit breaker by a phase angle calculation method described in Patent Document 1.

As shown in FIG. 1, the conventional earth leakage circuit breaker includes: a voltage application unit 20 connected between a power line and a neutral line to input a power supply voltage; a voltage reducing transformer 22 configured to reduce the voltage input from the voltage application unit 20; a first harmonic and noise removal filter 24 configured to pass only a commercial power frequency voltage and remove harmonic and noise signals from the voltage reduced by the voltage reducing transformer 22; a voltage phase detection unit 26 configured to detect a phase of the voltage output from the first harmonic and noise removal filter 24 to provide the detected phase to a phase angle calculation unit 28; a current sensing clamp 40 configured to measure a difference in the current between the power line and the neutral line; a current sensing circuit 42 configured to detect an amount of the current measured by the current sensing clamp 40; an amplification circuit 44 configured to amplify outputs of the current sensing circuit 42; a second harmonic and noise removal filter 46 configured to pass only a commercial power frequency current and remove the harmonic and noise signals from the outputs of the amplification circuit 44; a current measurement A/D converter 48 configured to convert an analog current value provided by the second harmonic and noise removal filter 46 into a digital value and transmit the digital value to a leakage current analysis circuit 52; a current phase detection unit 50 configured to detect the phase of the current provided by the second harmonic and noise removal filter 46 and transmit the detected phase to the phase angle calculation unit 28; a phase angle calculation unit 28 configured to calculate a phase angle using a voltage phase value provided by the voltage phase detection unit 26 and a current phase value provided from the current phase detection unit 50; a leakage current analysis circuit 52 configured to calculate a resistance type leakage current Igr and a capacitive leakage current Igc using the phase angle provided by the phase angle calculation unit 28 and a leakage current vector sum Io measured by the current measurement A/D converter 48; and an earth leakage circuit breaker control circuit 56 configured to operate the earth leakage circuit breaker when it is determined to require an interruption of a power supply using the resistance type leakage current Igr and the capacitive leakage current Igc analyzed by the leakage current analysis circuit 52.

According to the prior art described in Patent Document 1, in the case of an electric leakage due to the capacitive reactance type leakage current, the earth leakage circuit breaker is operated only when the magnitude of the leakage current reaches a value of about 5 times the resistance type leakage current. Therefore, it seems that only an effect of preventing an unnecessary electric leakage interruption operation due to the capacitive reactance type leakage current may be obtained.

However, the conventional earth leakage circuit breaker of Patent Document 1 has a complicated configuration with a large number of parts, and thereby a process of determining whether to operate the earth leakage circuit breaker is complicated, which leads to an increase in costs.

These and other limitations of the prior art will become apparent to those of skill in the art upon a reading of the following descriptions and a study of the several figures of the drawing.

SUMMARY

In consideration of the above-described problems of the prior art, it is an object of the present invention to provide an integrated circuit for detecting leakage current and an earth leakage circuit breaker having the integrated circuit, that can effectively improve an operation of the earth leakage circuit breaker due to a reactance type leakage current including both a capacitive reactance type leakage current and an inductive reactance type leakage current while having a simple configuration with a small number of parts.

To achieve the above object, according to an aspect of the present invention, there is provided a semiconductor integrated circuit for detecting leakage current which outputs an interruption signal to cut off an electrical power supplied from a power supply to an electric line if a leakage current occurs due to an electric leakage, the semiconductor integrated circuit for detecting leakage current including: a leakage current processing unit configured to count a predetermined number N from a point in which a power supply voltage of the power supply is 0 V, latch the counted count value at a point in which an input induction voltage calculated from the leakage current becomes 0 V, calculate an output induction voltage from the counted count value, the input induction voltage and the predetermined number N, and output a trip signal when a magnitude of the calculated output induction voltage is greater than a predetermined trip level; and an output unit configured to be operated according to the trip signal and output an interruption signal.

In addition, according to another aspect of the present invention, there is provided an earth leakage circuit breaker including: the above semiconductor integrated circuit for detecting leakage current; an electric leakage signal input unit configured to calculate the input induction voltage; and a trip means configured to be operated by the interruption signal to cut off an electrical power to the electric line.

The earth leakage circuit breaker of the present invention is sensitively operated for the resistance type electric leakage having a high risk of fire, etc. even when a relatively small amount of leakage current occurs to cut off an electrical power to the electric line, but performs an interruption operation for the reactance type electric leakage having a relatively low risk of fire only when a relatively large amount of leakage current occurs compared to the resistance type leakage current. Therefore, it is possible to prevent the earth leakage circuit breaker from unnecessarily performing the interruption operation when a reactance type electric leakage occurs such as capacitance and inductive reactance, and thereby secure reliability in the operation of the earth leakage circuit breaker.

In addition, according to the earth leakage circuit breaker of the present invention, it is possible to distinguish between a resistance type electric leakage and a reactance type electric leakage by simple configuration and operation compared to the conventional earth leakage circuit breaker. Among them, the earth leakage circuit breaker is operated only when there is a high risk of fire because the resistance type leakage current is relatively larger than the reactance type leakage current, so as to cut off an electrical power to the electric line. Therefore, it is possible to provide an earth leakage circuit breaker with high reliability in the operation at a low cost.

These and other embodiments, features and advantages will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following figures:

FIG. 6 is a timing chart illustrating an operation of the earth leakage circuit breaker at the time of an earth leakage due to a form in which the resistance type and the capacitive reactance type leakage currents are mixed.

FIG. 7 is a timing chart illustrating an operation of the earth leakage circuit breaker at the time of an earth leakage due to the form in which the resistance type and the capacitive reactance type leakage currents are mixed.

DETAILED DESCRIPTION OF EXAMPLE EMBODIMENT(S)

Figure 1:
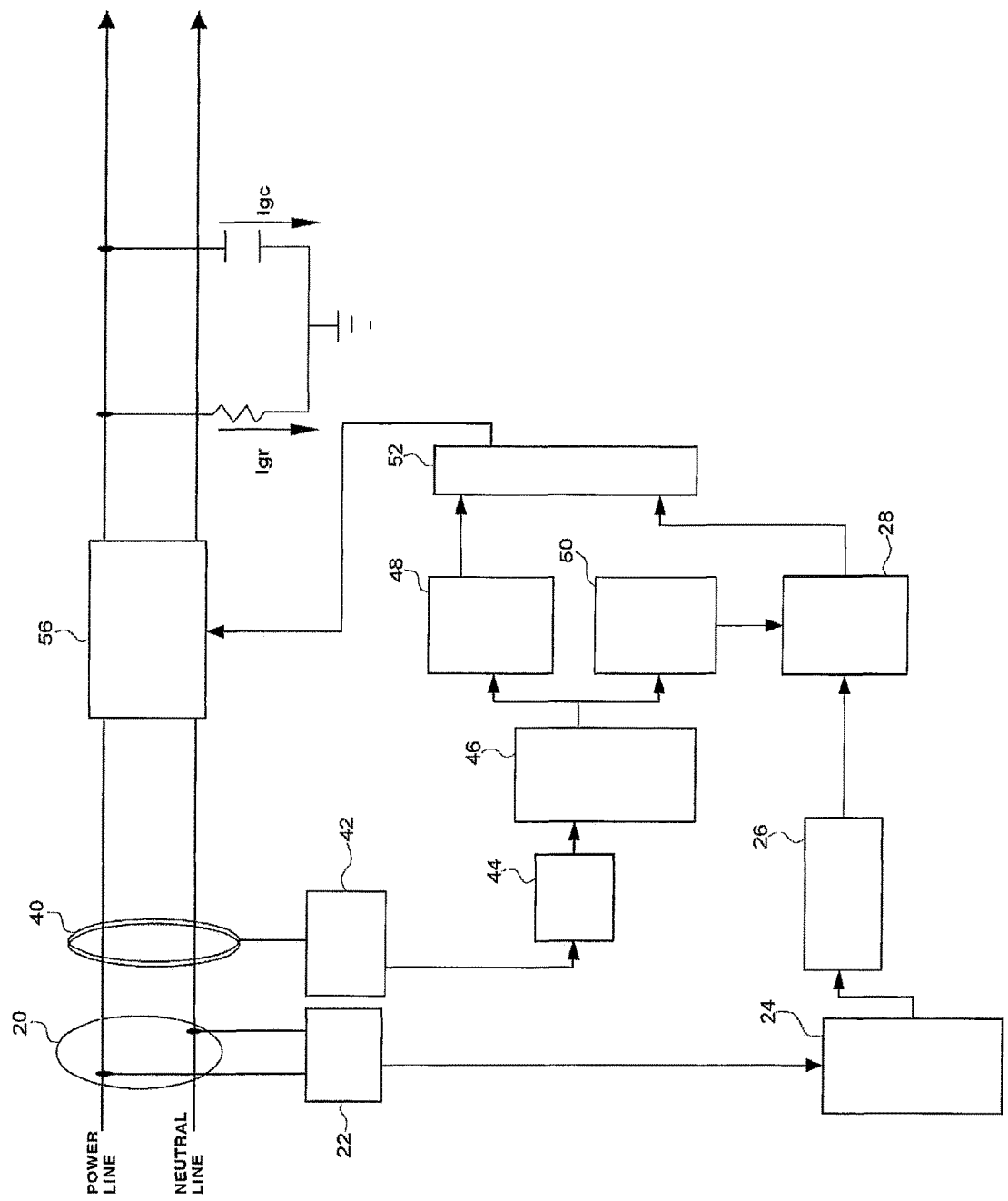
FIG. 1 is a view illustrating a schematic configuration of an earth leakage circuit breaker by a conventional phase angle calculation method.
Figure 2:
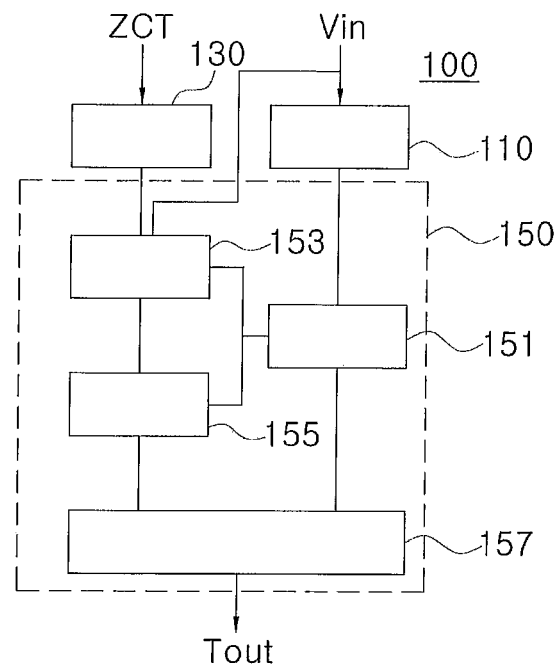
FIG. 2 is a block diagram illustrating a construction of an earth leakage circuit breaker according to a preferred embodiment of the present invention.

Hereinafter, an earth leakage circuit breaker according to a preferred embodiment of the present invention will be described in detail with reference to the accompanying drawings. FIG. 2 is a block diagram illustrating a construction of the earth leakage circuit breaker according to the preferred embodiment of the present invention.

As shown in FIG. 2, an earth leakage circuit breaker 100 according to the preferred embodiment of the present invention includes a voltage conversion unit 110, an electric leakage signal input unit 130, and an integrated circuit 150 for detecting leakage current.

The voltage conversion unit 110 converts a power supply voltage Vin supplied from a power supply (not illustrated) into a voltage suitable for use in the integrated circuit 150 for detecting leakage current to supply the voltage to a signal generation unit 151 of the integrated circuit 150 for detecting leakage current, which will be described below.

The electric leakage signal input unit 130 is installed in an electric line, and when a ground fault occurs in the electric line or an electric device, etc., receives a leakage current Ir input from zero current transformer (ZCT) (not illustrated) that detects a leakage current flowing in the electric line. The leakage current Ir input from the zero current transformer (ZCT) is converted into an input induction voltage Vii by the electric leakage signal input unit 130 to be supplied to the integrated circuit 150 for detecting leakage current.

All of the zero current transformer (ZCT), the voltage conversion unit 110, and the electric leakage signal input unit 130 have well-known configurations, and therefore will not be further described in detail.

The integrated circuit 150 for detecting leakage current determines whether there is an electric leakage in the electric line, etc. based on the leakage current Ir which is detected by the zero current transformer (ZCT) and input through the electric leakage signal input unit 130, and when it is determined that there is an occurrence of electric leakage in the electric line, etc. as a result of determination, outputs a trip signal to separate an electrical connection of the electric line from the power supply.

The integrated circuit 150 for detecting leakage current includes a signal generation unit 151, a leakage current processing unit 153, a signal processing unit 155, and an output unit 157.

The signal generation unit 151 generates signals necessary for each unit using the voltage input from the voltage conversion unit 110 and supplies the signals to each unit such as the leakage current processing unit 153, the signal processing unit 155 and the output unit 157.

The leakage current processing unit 153 executes necessary processing using an input induction voltage Vii signal output from the zero current transformer (ZCT) (not illustrated) through the electric leakage signal input unit 130 and a power supply voltage Vin signal input from the power supply (not illustrated), and outputs the processed results to the signal processing unit 155, which will be described in detail below.

The signal processing unit 155 executes necessary processing such as, for example, an amplification on a trip signal TP output from the leakage current processing unit 153, and outputs the processed results to the output unit 157.

The output unit 157 is operated based on the output signals output from the signal processing unit 155 and outputs an interruption signal Tout for operating a trip coil (not illustrated) of the earth leakage circuit breaker, so as to cut off the electrical power to the electric line.

Figure 3:
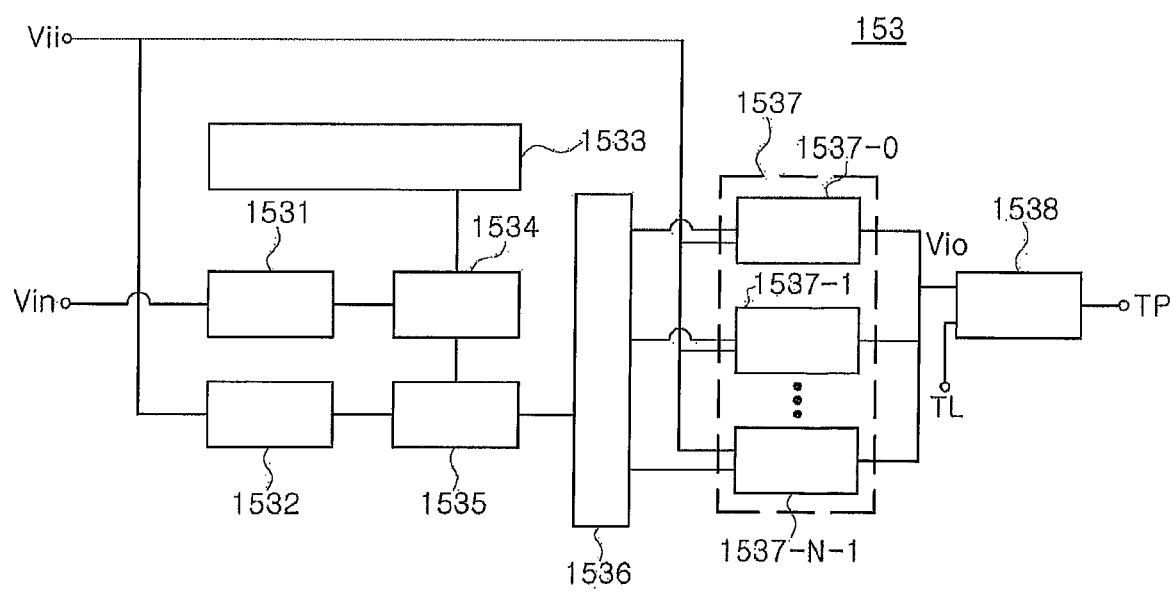
FIG. 3 is a block diagram illustrating detailed configurations of a leakage current processing unit shown in FIG. 2.

Next, details of the leakage current processing unit 153 according to the preferred embodiment of the present invention will be described in detail with reference to FIG. 3. FIG. 3 is a block diagram illustrating detailed configurations of the leakage current processing unit 153.

The leakage current processing unit 153 includes a zero-power supply voltage detector 1531, a zero-input induction voltage detector 1532, a frequency oscillator 1533, a counter 1534, a counter latch 1535, a selector 1536, an output induction voltage setting unit 1537, and a comparator 1538.

The zero-power supply voltage detector 1531 generates a pulse signal Pin (hereinafter, referred to as a "power supply voltage pulse signal Pin" in the present disclosure) whenever a magnitude of the power supply voltage Vin input from the power supply (not illustrated) becomes 0 V to output the generated signal to the counter 1534.

The zero-input induction voltage detector 1532 generates a pulse signal Pii (hereinafter, referred to as a "leakage current pulse signal Pii" in the present disclosure) whenever a magnitude of the input induction voltage Vii output from the electric leakage signal input unit 130 becomes 0 V to output the generated signal to the counter latch 1535.

The frequency oscillator 1533 outputs a pulse signal of a constant frequency to the counter 1534.

The counter 1534 counts a predetermined number for a ½ cycle of the power supply voltage Vin, that is, a predetermined number of N from 0 to N-1, for example, whenever the zero-power supply voltage detector 1531 detects 0 V.

Accordingly, when the power supply voltage pulse signal Pin is input from the zero-power supply voltage detector 1531, the counter 1534 starts counting to count the predetermined number of N from 0 to N-1, and outputs the count value to the counter latch 1535 in sequence. When a new power supply voltage pulse signal Pin is input from the zero-power supply voltage detector 1531, the counter initializes the count value previously counted and starts counting again from 0.

The counter latch 1535 receives the count value counted by the counter 1534, and when the leakage current pulse signal Pii is input from the zero-input induction voltage detector 1532, latches the count value input from the counter 1534 and outputs a latched count value LT to the selector 1536.

The selector 1536 selects an output induction voltage calculation unit corresponding to the count value LT latched by the counter latch 1535 among a plurality of output induction voltage calculation units 1537-0, 1537-1, . . . and 1537-N-1 of the output induction voltage setting unit 1537, and outputs the latched count value LT to the selected output induction voltage calculation unit.

The output induction voltage setting unit 1537 includes the number of output induction voltage calculation units 1537-0, 1537-1, . . . and 1537-N-1 corresponding to the number N counted by the counter 1534 for a ½ cycle of the power supply voltage Vin. Each of the output induction voltage calculation units 1537-0, 1537-1, . . . and 1537-N-1 calculates an output induction voltage Vio corresponding to the input induction voltage Vii input from the electric leakage signal input unit 130 and the latched count value LT input from the selector 1536 using Equation 1 below, and outputs the calculated output induction voltage Vio to the comparator 1538.

$$Vio = \frac{LT - 0.5N}{0.5N} \times Vii \qquad [\text{Equation 1}]$$

Wherein, Vio is the output induction voltage, LT is the count value latched by the leakage current pulse signal Pii, N is a maximum value of count values counted by the counter 1534 for a ½ cycle of the power supply voltage Vin, and Vii is the input induction voltage calculated from the leakage current Ir by the electric leakage signal input unit 130.

The comparator 1538 compares the output induction voltage Vio calculated by the output induction voltage setting unit 1537 with a preset trip level ((+) trip level or (−) trip level), and if the magnitude of the output induction voltage Vio is greater than the trip level, outputs the trip signal TP to the signal processing unit 155.

Next, operations of the earth leakage circuit breaker 100 according to the preferred embodiment of the present invention will be described in detail with reference to FIGS. 4 to 6.

Figure 4:
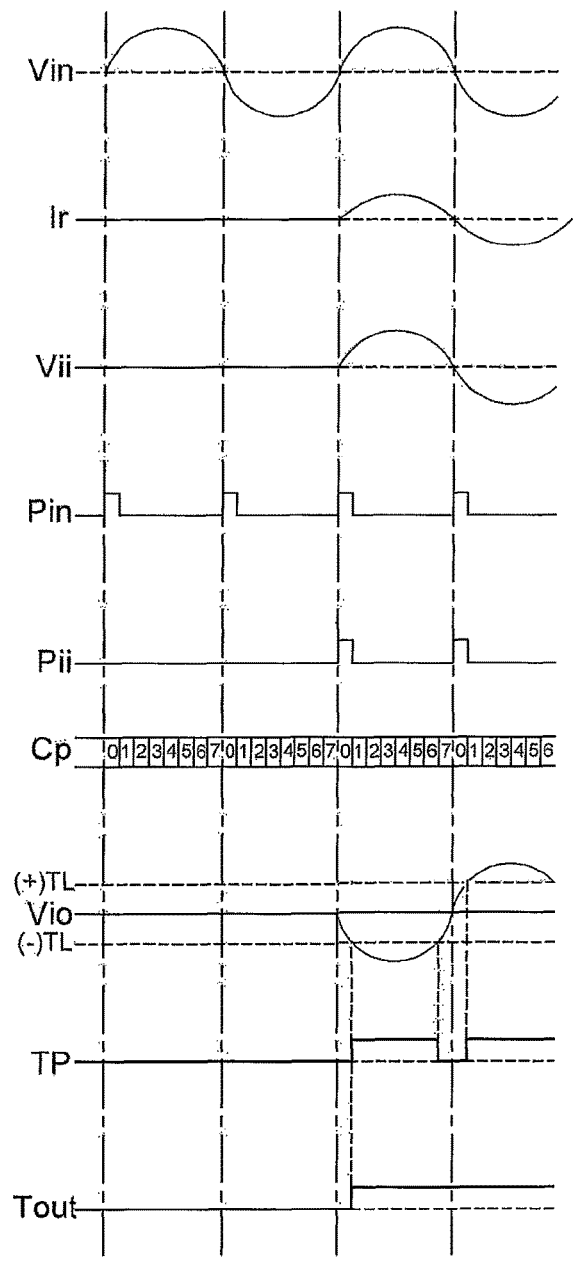
FIG. 4 is a timing chart illustrating an operation of the earth leakage circuit breaker at the time of an earth leakage due to a resistance type leakage current.
Figure 5:
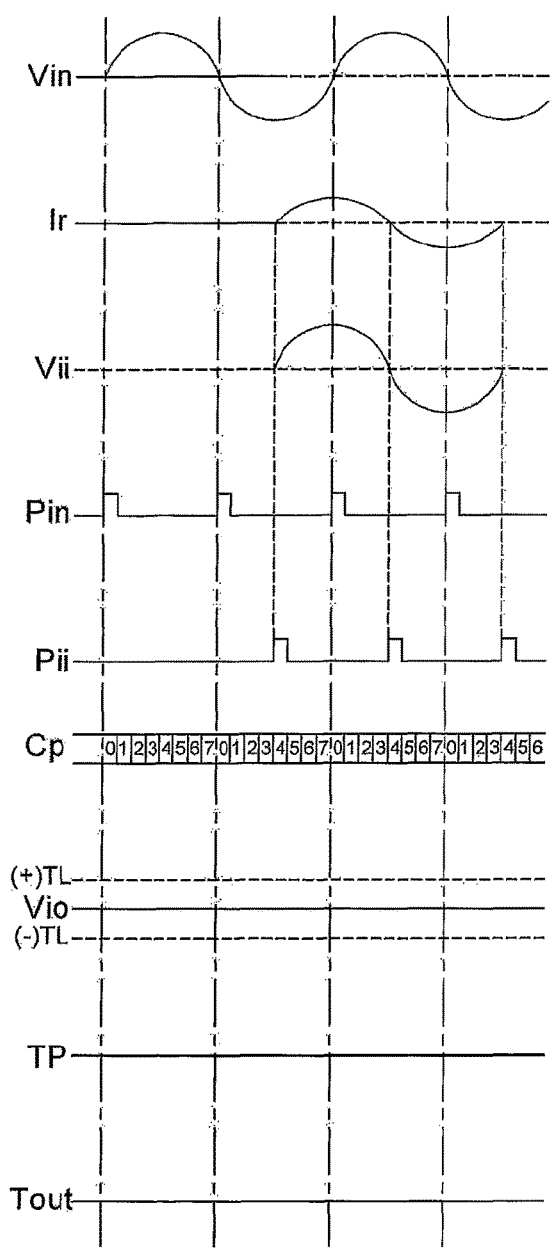
FIG. 5 is a timing chart illustrating an operation of the earth leakage circuit breaker at the time of earth leakage due to a capacitive reactance type leakage current.

FIG. 4 is a timing chart illustrating an operation of the earth leakage circuit breaker at the time of an earth leakage due to a resistance type leakage current, FIG. 5 is a timing chart illustrating an operation of the earth leakage circuit breaker at the time of earth leakage due to a capacitive reactance type leakage current, and FIGS. 6 and 7 are timing charts illustrating an operation of the earth leakage circuit breaker at the time of an earth leakage due to a form in which the resistance type leakage current and the capacitive reactance type leakage current are mixed.

First, the operation at the time of electric leakage due to only the resistance type leakage current of FIG. 4 will be described.

When an electric leakage occurs in the electric line and the resistance type leakage current Ir is input from the zero current transformer (ZCT) (not illustrated), the electric leakage signal input unit 130 converts it into an input induction voltage Vii and outputs the converted voltage to the leakage current processing unit 153.

At the same time, the zero-power supply voltage detector 1531 of the leakage current processing unit 153 outputs the power supply voltage pulse signal Pin to the counter 1534 whenever the power supply voltage Vin becomes 0 V, and the counter 1534 counts the predetermined number of N from 0 to N-1 by the power supply voltage pulse signal Pin until the next power supply voltage pulse signal Pin is input, and outputs the counted count value to the counter latch 1535. Herein, when the predetermined number N is 8, for example, as shown in FIG. 5, the counter 1534 sequentially counts 0 to 7 until the next power supply voltage pulse signal Pin is input.

In addition, when the input induction voltage Vii is input from the electric leakage signal input unit 130, the zero-input induction voltage detector 1532 of the leakage current processing unit 153 outputs the leakage current pulse signal Pii to the counter latch 1535 whenever the input induction voltage Vii becomes 0 V. When this leakage current pulse signal Pii is input, the counter latch 1535 latches the count value input from the counter 1534, and outputs the latched count value LT to the selector 1536.

Then, the selector 1536 selects an output induction voltage calculation unit corresponding to the count value LT latched by the counter latch 1535 among the plurality of output induction voltage calculation units 1537-0, 1537-1, . . . and 1537-N-1 of the output induction voltage setting unit 1537, and outputs the latched count value LT thereto, and the selected output induction voltage calculation unit calculates the output induction voltage Vio using the input induction voltage Vii input from the electric leakage signal input unit 130 and the latched count value LT by Equation 1, and outputs the calculated output induction voltage Vio to the comparator 1538.

As in the example of FIG. 4, when the leakage current input from the zero current transformer (ZCT) is only the resistance type leakage current, the phase of the leakage current Ir input to the electric leakage signal input unit 130 is the same as the phase of the power supply voltage Vin, such that the phase of the input induction voltage Vii output from the electric leakage signal input unit 130 is also the same as the phase of the power supply voltage Vin. Therefore, the phase of the power supply voltage pulse signal Pin and the phase of the leakage current pulse signal Pii also become the same phase, such that the latched count value LT becomes 0. Thereby, the selector 1536 selects a first output induction voltage calculation unit 1537-0 among the plurality of output induction voltage calculation units 1537-0, 1537-1, . . . and 1537-N-1, and outputs a latched count value LT 0.

Then, the output induction voltage calculation unit 1537-0 selected by the selector 1536 calculates the output induction voltage Vio by Equation 1. At this time, the output induction voltage Vio calculated by the output induction voltage calculation unit 1537-0 may be represented by Equation 2 below.

$$Vio = \frac{0 - (0.5 \times 8)}{(0.5 \times 8)} Vii = -Vii \qquad \text{[Equation 2]}$$

The output induction voltage calculation unit 1537-0 outputs the calculated output induction voltage (Vio=−Vii) to the comparator 1538.

Thereafter, the comparator 1538 compares the output induction voltage Vio output from the output induction voltage calculation unit 1537-0 with the trip level TL, and determines whether to output the trip signal TP by determining whether the output induction voltage Vio output from the output induction voltage setting unit 1537 (i.e., calculation unit 1537-0) is greater than the trip level. In the example of FIG. 4, since the output induction voltage Vio is greater than the trip level, the trip signal TP is output to the signal processing unit 155, and thereby the output unit 157 outputs the interruption signal Tout to operate the trip coil (not illustrated), so as to cut off an electrical power to the electric line.

Next, as in the example of FIG. 5, when the leakage current input from the zero current transformer (ZCT) is only the capacitive reactance type leakage current, the phase of the leakage current Ir input to the electric leakage signal input unit 130 is faster by 90 degrees than the phase of the power supply voltage Vin, such that the phase of the input induction voltage Vii output by the electric leakage signal input unit 130 is also faster by 90 degrees than the phase of the power supply voltage Vin. Therefore, since the phase of the leakage current pulse signal Pii is also faster by 90 degrees than the phase of the power supply voltage pulse signal Pin, the count value LT latched by the counter latch 1535 becomes 4 in the example of FIG. 4. Thereby, the selector 1536 selects a fifth output induction voltage calculation unit 1537-4 among the plurality of output induction voltage calculation units 1537-0, 1537-1, . . . and 1537-N-1 of the output induction voltage setting unit 1537 and outputs a latched count value LT 4 thereto.

Then, the output induction voltage calculation unit 1537-4 selected by the selector 1536 calculates the output induction voltage Vio by Equation 1. At this time, the output induction voltage Vio calculated by the output induction voltage calculation unit 1537-4 is represented by Equation 3 below.

$$Vio = \frac{4 - (0.5 \times 8)}{(0.5 \times 8)} Vii = 0 \qquad \text{[Equation 3]}$$

The output induction voltage calculation unit 1537-4 outputs the calculated output induction voltage (Vio=0) to the comparator 1538.

Thereafter, the comparator 1538 compares the output induction voltage Vio output from the output induction voltage calculation unit 1537-4 with the trip level TL. As a result, since the output induction voltage Vio output from the output induction voltage calculation unit 1537-4 is smaller than the trip level, the comparator 1538 does not output the trip signal TP to the signal processing unit 155. Therefore, the output unit 157 also does not output the interruption signal Tout to the trip coil (not illustrated).

Meanwhile, on the contrary to the leakage current due to the capacitance reactance type electric leakage, since the phase of the leakage current Ir is slower by 90 degrees than the phase of the power supply voltage Vin, the phase of the input induction voltage Vii is also slower by 90 degrees than the phase of the power supply voltage Vin, and thereby, except for the above-described fact, the leakage current due to the inductive reactance type electric leakage is the same as the example of the leakage current due to the capacitive reactance type electric leakage, therefore will not be described in detail herein.

Next, as in the examples of FIGS. 6 and 7, the operations of the earth leakage circuit breaker 100 in a case, in which the leakage current input from the zero current transformer (ZCT) is a combined leakage current of the resistance type leakage current with the capacitive reactance type leakage current, will be described. For example, it can be said that the case of using a capacitive load such as an electric welding machine corresponds to this example. FIGS. 6 and 7 show examples of cases in which the magnitudes of the combined leakage currents are the same as each other, but ratios between the resistance type leakage current and the capacitive reactance type leakage current are different from each other, wherein FIG. 6 shows an example of a case in which the resistance type leakage current is greater than the trip level, and FIG. 7 shows an example of a case in which the resistance type leakage current is smaller than the trip level.

First, as shown in FIG. 6, when the resistance type leakage current is relatively large compared to the capacitive reactance type leakage current, and the count value LT latched by the counter latch 1535 is 7, the selector 1536 selects an eighth output induction voltage calculation unit 1537-N-1 among the plurality of output induction voltage calculation units 1537-0, 1537-1, . . . and 1537-N-1 of the output induction voltage setting unit 1537, and outputs a latched count value LT 7 thereto. Then, the output induction voltage calculation unit 1537-N-1 selected by the selector 1536 calculates the output induction voltage Vio by Equation 1. At this time, the output induction voltage Vio calculated by the output induction voltage calculation unit 1537-N-1 is represented by Equation 4 below.

$$Vio = \frac{7 - (0.5 \times 8)}{(0.5 \times 8)} Vii = \frac{3}{4} Vii \quad [\text{Equation 4}]$$

The output induction voltage calculation unit 1537-N-1 outputs the calculated output induction voltage (Vio=¾Vii) to the comparator 1538. In the example of FIG. 6, since the output induction voltage Vio output from the output induction voltage calculation unit 1537-7 is greater than the trip level, the comparator 1538 outputs the trip signal TP to the signal processing unit 155. Thereby, the output unit 157 outputs the interruption signal Tout for operating the trip coil (not illustrated), so as to cut off an electrical power to the electric line.

In contrast, in the case of FIG. 7, since the count value LT latched by the counter latch 1535 is 5, the selector 1536 selects a sixth output induction voltage calculation unit 1537-5 among the plurality of output induction voltage calculation units 1537-0, 1537-1, . . . and 1537-N-1 of the output induction voltage setting unit 1537, and outputs a latched count value LT 5 thereto. The output induction voltage calculation unit 1537-5 calculates the output induction voltage Vio as shown in Equation 5 below using Equation 1. That is, the output induction voltage Vio calculated by the output induction voltage calculation unit 1537-5 is represented as follows.

$$Vio \frac{5 - (0.5 \times 8)}{(0.5 \times 8)} Vii = \frac{1}{4} Vii \quad [\text{Equation 5}]$$

In the example of FIG. 7, since the output induction voltage Vio output from the output induction voltage calculation unit 1537-5 is smaller than the trip level, the comparator 1538 does not output the trip signal TP to the signal processing unit 155. Thereby, the output unit 157 also does not output the interruption signal Tout to the trip coil (not illustrated).

As shown in the examples of FIGS. 6 and 7, when the leakage current input from the zero current transformer (ZCT) is the combined leakage current due to an electric leakage, in which the resistance type leakage current and the reactance type leakage current are combined, if the resistance type leakage current among the combined leakage currents is greater than the trip level, the leakage current processing unit 153 of the present invention outputs the trip signal TP to operate the earth leakage circuit breaker, so as to cut off the electrical power to the load side from the power supply. However, if the resistance type leakage current among the combined leakage currents is smaller than the trip level, the leakage current processing unit 153 of the present invention does not output the trip signal TP, and therefore, the earth leakage circuit breaker does not perform the interruption operation.

Table 1 below shows the output induction voltages Vio for each count value LT latched by the counter latch 1535 depending on a phase difference between the leakage current Ir input from the zero current transformer (ZCT) and the power supply voltage Vin, when the maximum value of the count values counted by the counter 1534 for a ½ cycle of the power supply voltage Vin is 8, that is, N=8.

TABLE 1

| Phase | Latched count value LT | Output induction voltage Vio |
|---|---|---|
| 0 | 0 | −Vii |
| 22.5 | 1 | −¾ Vii |
| 45 | 2 | −½ Vii |
| 67.5 | 3 | −¼ Vii |
| 90 | 4 | 0 |
| −67.5 | 5 | ¼ Vii |
| −45 | 6 | ½ Vii |
| −22.5 | 7 | ¾ Vii |

Figure 8:
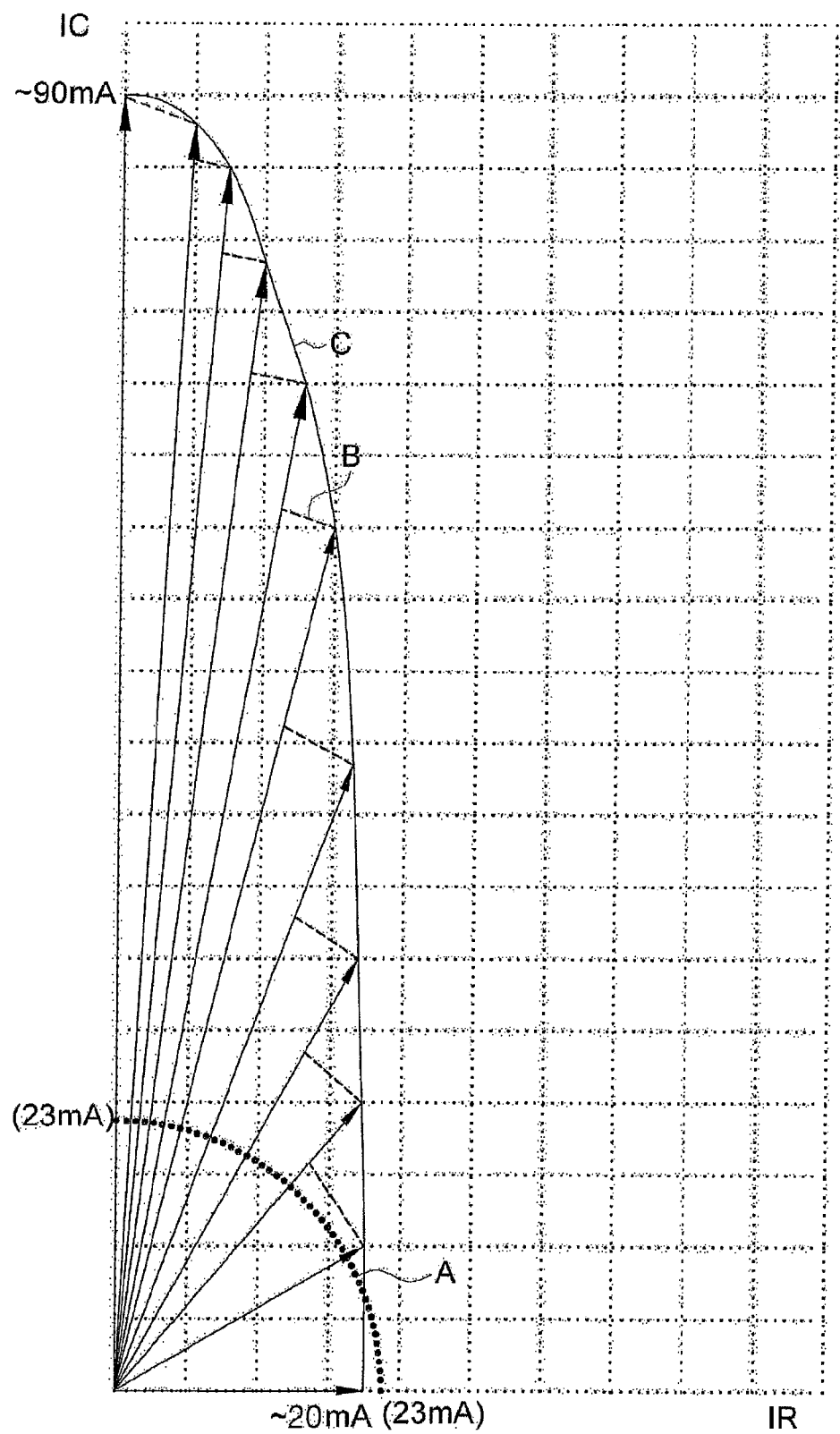
FIG. 8 is a graph illustrating an example of an interruption range of an earth leakage circuit breaker having a capacity of 30 mA.

FIG. 8 is a graph illustrating an example of an interruption range of an earth leakage circuit breaker having a capacity of 30 mA, wherein a dotted line A represents an interruption range of the conventional earth leakage circuit breaker, and dotted lines B represent an interruption range of the earth leakage circuit breaker of the present embodiment. As shown in FIG. 8, it can be seen that the conventional earth leakage circuit breaker performs an interruption operation at 23 mA for both the resistance type leakage current and the capacitive reactance type leakage current, whereas the earth leakage circuit breaker of the present embodiment performs an interruption operation at 20 mA for the resistance type leakage current, but also performs the interruption operation at 90 mA for the capacitive reactance type leakage current. Therefore, it can be seen that the earth leakage circuit breaker of the present embodiment is sensitively operated for the resistance type electric leakage having a high risk of fire, etc. even when a relatively small amount of leakage current occurs to cut off an electrical power to the electric line, but performs the interruption operation for the inductive reactance type electric leakage having a relatively low risk of fire only when a relatively large amount of leakage current occurs compared to the resistance type electric leakage.

Therefore, it is possible to prevent the earth leakage circuit breaker from unnecessarily performing the interruption operation when a reactance type electric leakage occurs, and thereby secure reliability in the operation of the earth leakage circuit breaker.

In addition, according to the earth leakage circuit breaker 100 of the present embodiment described above, it is possible to distinguish between the resistance type electric leakage and the reactance type electric leakage by the simple configuration and operation compared to the conventional earth leakage circuit breaker. Among them, the earth leakage circuit breaker is operated only when there is a high risk of fire because the resistance type leakage current is relatively larger than the reactance type leakage current, so as to cut off the electrical power to the load side from the power supply. Therefore, it is possible to provide an earth leakage circuit breaker with high reliability in the operation at a low cost.

While the present invention has been described with reference to the preferred embodiment, the present invention is not limited to the above-described embodiment, and it will be understood by those skilled in the related art that various modifications and variations may be made therein without departing from the scope of the present invention as defined by the appended claims.

For example, in the above-described embodiment, the example, in which the output induction voltage setting unit 1537 calculates the output induction voltage Vio by Equation 1, has been described, but the output induction voltage setting unit 1537 may calculate the output induction voltage Vio by Equation 6 below.

$$Vio = k_{LT}\frac{LT - 0.5N}{0.5N} \times Vii \quad \text{[Equation 6]}$$

wherein, Vio is the output induction voltage, LT is the count value latched by the leakage current pulse signal Pii, N is the maximum value of count values counted by the counter 1534 for a ½ cycle of the power supply voltage Vin, Vii is an input induction voltage calculated by the electric leakage signal input unit 130 from the leakage current Ir, and $k_{LT}$ is a correction coefficient.

The correction coefficient $k_{LT}$ is a preset value for each latched count value LT output from the counter latch 1535, and it is preferable that a range of the leakage current in which the earth leakage circuit breaker performs the interruption operation is a linear shape as shown in a solid line C of FIG. 8. However, since the number counted by the counter 1534 for a ½ cycle of the power supply voltage is divided into N, as the dotted lines B of FIG. 8, the range of the leakage current, in which the earth leakage circuit breaker of the above-described embodiment performs the interruption operation, should be a stepped shape. In this case, the correction coefficient $k_{LT}$ is a value for correcting the value of the output induction voltage Vio calculated by the output induction voltage setting unit 1537 so that the range, in which the earth leakage circuit breaker of the present invention performs the interruption operation, is close to the linear shape such as the solid line C of FIG. 8, and is a value set in advance by a pre-test or the like.

DESCRIPTION OF REFERENCE NUMERALS

100: Earth leakage circuit breaker
130: Electric leakage signal input unit
150: Integrated circuit for detecting leakage current
151: Signal generation unit
153: Leakage current processing unit
155: Signal processing unit
157: Output unit
1531: Zero-power supply voltage detector
1532: Zero-input induction voltage detector
1534: Counter
1535: Latch
1536: Selector
1537: Output induction voltage setting unit
1538: Comparator Although various embodiments have been described using specific terms and devices, such description is for illustrative purposes only. The words used are words of description rather than of limitation. It is to be understood that changes and variations may be made by those of ordinary skill in the art without departing from the spirit or the scope of various inventions supported by the written disclosure and the drawings. In addition, it should be understood that aspects of various other embodiments may be interchanged either in whole or in part. It is therefore intended that the claims be interpreted in accordance with the true spirit and scope of the invention without limitation or estoppel.

What is claimed is:

1. A semiconductor integrated circuit for detecting leakage current which outputs an interruption signal to cut off an electrical power supplied from a power supply to an electric line if a leakage current occurs due to an electric leakage, the semiconductor integrated circuit for detecting leakage current comprising:
    a leakage current processing unit configured to count a predetermined number N from a point in which a power supply voltage of the power supply is 0 V, latch the counted count value at a point in which an input induction voltage calculated from the leakage current becomes 0 V, calculate an output induction voltage from the counted count value, the input induction voltage and the predetermined number N, and output a trip signal when a magnitude of the calculated output induction voltage is greater than a predetermined trip level; and
    an output unit configured to be operated according to the trip signal and output an interruption signal.

2. The semiconductor integrated circuit for detecting leakage current according to claim 1, wherein the leakage current processing unit calculates the output induction voltage by the following equation:

$$Vio = \frac{LT - 0.5N}{0.5N} \times Vii$$

wherein, Vio is the output induction voltage, LT is a latched count value, N is a maximum value of count values counted for a ½ cycle of the power supply voltage, and Vii is the input induction voltage.

3. The semiconductor integrated circuit for detecting leakage current according to claim 1, wherein the leakage current processing unit calculates the output induction voltage by the following equation:

$$Vio = k_{LT} \frac{LT - 0.5N}{0.5N} \times Vii$$

wherein, Vio is the output induction voltage, $k_{LT}$ is a correction coefficient, LT is a latched count value, N is a maximum value of count values counted for a ½ cycle of the power supply voltage, and Vii is the input induction voltage.

4. The semiconductor integrated circuit for detecting leakage current according to claim 1, wherein the leakage current processing unit comprises:
   a zero-power supply voltage detector configured to output a power supply voltage pulse signal whenever the power supply voltage becomes 0 V;
   a counter configured to count the predetermined number N when the power supply voltage pulse signal is input;
   a zero-input induction voltage detector configured to output a leakage current pulse signal whenever the input induction voltage becomes 0 V;
   a counter latch configured to latch the count value counted by the counter when the leakage current pulse signal is input, and output the latched count value;
   an output induction voltage setting unit configured to calculate an output induction voltage from the latched count value, the input induction voltage, and the predetermined number N; and
   a comparator configured to compare the output induction voltage with a predetermined trip level and output a trip signal when a magnitude of the output induction voltage is greater than the trip level.

5. The semiconductor integrated circuit for detecting leakage current according to claim 4, wherein the output induction voltage setting unit includes a plurality of output induction voltage calculation units of the same number as the number N counted by the counter for a ½ cycle of the power supply voltage,
   the leakage current processing unit further comprises a selector configured to select an output induction voltage calculation unit corresponding to the latched count value among the plurality of output induction voltage calculation units, and output the latched count value to the selected output induction voltage calculation unit, and
   the output induction voltage is calculated by the output induction voltage calculation unit selected by the selector.

6. An earth leakage circuit breaker comprising:
   a leakage current processing unit configured to count a predetermined number N from a point in which a power supply voltage of the power supply is 0 V, latch the counted count value at a point in which an input induction voltage calculated from the leakage current becomes 0 V, calculate an output induction voltage from the counted count value, the input induction voltage and the predetermined number N, and output a trip signal when a magnitude of the calculated output induction voltage is greater than a predetermined trip level;
   an output unit configured to be operated according to the trip signal and output an interruption signal;
   an electric leakage signal input unit configured to calculate the input induction voltage; and
   a trip means configured to be operated by the interruption signal to cut off an electrical power to the electric line.

7. The semiconductor integrated circuit for detecting leakage current according to claim 6, wherein the leakage current processing unit calculates the output induction voltage by the following equation:

$$Vio = \frac{LT - 0.5N}{0.5N} \times Vii$$

wherein, Vio is the output induction voltage, LT is a latched count value, N is a maximum value of count values counted for a ½ cycle of the power supply voltage, and Vii is the input induction voltage.

8. The semiconductor integrated circuit for detecting leakage current according to claim 6, wherein the leakage current processing unit calculates the output induction voltage by the following equation:

$$Vio = k_{LT} \frac{LT - 0.5N}{0.5N} \times Vii$$

wherein, Vio is the output induction voltage, $k_{LT}$ is a correction coefficient, LT is a latched count value, N is a maximum value of count values counted for a ½ cycle of the power supply voltage, and Vii is the input induction voltage.

9. The semiconductor integrated circuit for detecting leakage current according to claim 6, wherein the leakage current processing unit comprises:
   a zero-power supply voltage detector configured to output a power supply voltage pulse signal whenever the power supply voltage becomes 0 V;
   a counter configured to count the predetermined number N when the power supply voltage pulse signal is input;
   a zero-input induction voltage detector configured to output a leakage current pulse signal whenever the input induction voltage becomes 0 V;
   a counter latch configured to latch the count value counted by the counter when the leakage current pulse signal is input, and output the latched count value;
   an output induction voltage setting unit configured to calculate an output induction voltage from the latched count value, the input induction voltage, and the predetermined number N; and
   a comparator configured to compare the output induction voltage with a predetermined trip level and output a trip signal when a magnitude of the output induction voltage is greater than the trip level.

10. The semiconductor integrated circuit for detecting leakage current according to claim 6, wherein the output induction voltage setting unit includes a plurality of output induction voltage calculation units of the same number as the number N counted by the counter for a ½ cycle of the power supply voltage,
    the leakage current processing unit further comprises a selector configured to select an output induction voltage calculation unit corresponding to the latched count value among the plurality of output induction voltage calculation units, and output the latched count value to the selected output induction voltage calculation unit, and
    the output induction voltage is calculated by the output induction voltage calculation unit selected by the selector.

* * * * *